(12) United States Patent
Odnoblyudov et al.

(10) Patent No.: US 12,132,155 B2
(45) Date of Patent: Oct. 29, 2024

(54) ETCHED TRENCHES IN BOND MATERIALS FOR DIE SINGULATION, AND ASSOCIATED SYSTEMS AND METHODS

(71) Applicant: Micron Technology, Inc., Boise, ID (US)

(72) Inventors: Vladimir Odnoblyudov, Eagle, ID (US); Scott D. Schellhammer, Meridian, ID (US); Jeremy S. Frei, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 438 days.

(21) Appl. No.: 17/145,752

(22) Filed: Jan. 11, 2021

(65) Prior Publication Data

US 2021/0135067 A1    May 6, 2021

Related U.S. Application Data

(60) Continuation of application No. 16/008,836, filed on Jun. 14, 2018, now Pat. No. 10,892,384, which is a
(Continued)

(51) Int. Cl.
*H01L 33/52*    (2010.01)
*H01L 21/56*    (2006.01)
(Continued)

(52) U.S. Cl.
CPC ............ *H01L 33/52* (2013.01); *H01L 21/561* (2013.01); *H01L 21/78* (2013.01); *H01L 23/3185* (2013.01); *H01L 33/0095* (2013.01); *H01L 33/20* (2013.01); *H01L 33/44* (2013.01); *H01L 33/62* (2013.01); *H01S 5/0201* (2013.01); *H01L 21/6836* (2013.01); *H01L 24/11* (2013.01); *H01L 24/13* (2013.01); *H01L 24/97* (2013.01); *H01L 2221/68327* (2013.01); *H01L 2221/68377* (2013.01); *H01L 2224/1146* (2013.01); *H01L 2224/13022* (2013.01); *H01L 2224/13124* (2013.01); *H01L 2224/13139* (2013.01); *H01L 2224/13144* (2013.01); *H01L 2224/13147* (2013.01); *H01L 2224/97* (2013.01); *H01L 2924/12041* (2013.01);
(Continued)

(58) Field of Classification Search
None
See application file for complete search history.

(56) References Cited

U.S. PATENT DOCUMENTS 3,701,696 A    10/1972   Mets
3,921,285 A  * 11/1975   Krall ...................... H01L 24/81
                                                                174/253
(Continued)

*Primary Examiner* — Erik T. K. Peterson
(74) *Attorney, Agent, or Firm* — Perkins Coie LLP

(57) ABSTRACT

Etched trenches in a bond material for die singulation, and associated systems and methods are disclosed. A method for solid state transducer device singulation in accordance with one embodiment includes forming a plurality of trenches by etching through a metallic bond material forming a bond between a carrier substrate and a plurality of the dies and singulating the carrier substrate along the trenches to separate the dies. In particular embodiments, the trenches extend into the carrier substrate. In further particular embodiments, the dies are at least partially encapsulated in a dielectric material.

20 Claims, 7 Drawing Sheets

Related U.S. Application Data division of application No. 14/617,668, filed on Feb. 9, 2015, now Pat. No. 10,020,432, which is a division of application No. 13/415,677, filed on Mar. 8, 2012, now Pat. No. 8,952,413.

(51) Int. Cl.

| | | |
|---|---|---|
| *H01L 21/683* | (2006.01) | |
| *H01L 21/78* | (2006.01) | |
| *H01L 23/00* | (2006.01) | |
| *H01L 23/31* | (2006.01) | |
| *H01L 33/00* | (2010.01) | |
| *H01L 33/20* | (2010.01) | |
| *H01L 33/44* | (2010.01) | |
| *H01L 33/62* | (2010.01) | |
| *H01S 5/02* | (2006.01) | |
| *H10K 50/84* | (2023.01) | |
| *H10K 50/844* | (2023.01) | |
| *H10K 71/00* | (2023.01) | |

(52) U.S. Cl.
CPC ............. *H01L 2924/12042* (2013.01); *H01L 2924/12044* (2013.01); *H01L 2933/005* (2013.01); *H01L 2933/0066* (2013.01); *H10K 50/84* (2023.02); *H10K 50/844* (2023.02); *H10K 71/00* (2023.02); *H10K 71/851* (2023.02); *Y02P 80/30* (2015.11)

(56) References Cited

U.S. PATENT DOCUMENTS

| | | | |
|---|---|---|---|
| 4,602,370 A * | 7/1986 | Tsang | H01S 5/4043 |
| | | | 257/97 |
| 4,855,199 A | 8/1989 | Bolon et al. | |
| 4,878,611 A * | 11/1989 | LoVasco | H05K 3/303 |
| | | | 228/245 |
| 4,966,862 A | 10/1990 | Edmond | |
| 5,062,680 A | 11/1991 | Imamura et al. | |
| 5,234,153 A * | 8/1993 | Bacon | H01L 24/29 |
| | | | 228/122.1 |
| 5,429,954 A | 7/1995 | Gerner | |
| 5,923,995 A | 7/1999 | Kao et al. | |
| 6,025,251 A | 2/2000 | Jakowetz et al. | |
| 6,197,609 B1 | 3/2001 | Tsutsui et al. | |
| 6,562,660 B1 | 5/2003 | Sakamoto et al. | |
| 6,642,079 B1 * | 11/2003 | Liu | H01L 24/16 |
| | | | 257/E21.511 |
| 6,686,225 B2 | 2/2004 | Wachtler | |
| 6,759,271 B2 | 7/2004 | Miyazaki | |
| 7,208,337 B2 | 4/2007 | Eisert et al. | |
| 7,514,291 B2 | 4/2009 | Akram | |
| 7,566,634 B2 | 7/2009 | Beyne et al. | |
| 8,012,857 B2 | 9/2011 | Grivna et al. | |
| 8,241,932 B1 | 8/2012 | Yu et al. | |
| 8,304,277 B2 | 11/2012 | Pagaila | |
| 2001/0038103 A1 | 11/2001 | Nitta et al. | |
| 2002/0009869 A1 * | 1/2002 | Cotte | H05K 3/3436 |
| | | | 257/E21.508 |
| 2002/0028527 A1 * | 3/2002 | Maeda | H01L 33/505 |
| | | | 257/E33.059 |
| 2003/0143819 A1 | 7/2003 | Hedler et al. | |
| 2004/0056254 A1 | 3/2004 | Bader et al. | |
| 2004/0235210 A1 | 11/2004 | Tamura et al. | |
| 2005/0062058 A1 * | 3/2005 | Ishida | H01S 5/2231 |
| | | | 257/99 |
| 2005/0202651 A1 | 9/2005 | Akram | |
| 2005/0214968 A1 * | 9/2005 | Waitl | H01L 21/52 |
| | | | 438/106 |
| 2006/0163587 A1 * | 7/2006 | Erchak | H01L 25/0753 |
| | | | 257/E33.059 |
| 2006/0214274 A1 * | 9/2006 | Shimokawa | H01L 24/83 |
| | | | 257/678 |
| 2006/0284321 A1 | 12/2006 | Wu et al. | |
| 2007/0087524 A1 | 4/2007 | Montgomery | |
| 2007/0126019 A1 | 6/2007 | Yamada et al. | |
| 2007/0187712 A1 * | 8/2007 | Yamada | H01L 24/32 |
| | | | 257/E33.068 |
| 2007/0262341 A1 * | 11/2007 | Liu | H01L 33/62 |
| | | | 257/103 |
| 2008/0006836 A1 | 1/2008 | Lee | |
| 2008/0048206 A1 * | 2/2008 | Lee | H01L 33/387 |
| | | | 257/E33.068 |
| 2008/0105907 A1 * | 5/2008 | Otremba | H01L 23/3107 |
| | | | 438/584 |
| 2008/0113462 A1 | 5/2008 | Kim et al. | |
| 2008/0179611 A1 | 7/2008 | Chitnis et al. | |
| 2009/0191690 A1 | 7/2009 | Boyle et al. | |
| 2009/0267096 A1 * | 10/2009 | Kim | H01L 33/0093 |
| | | | 257/98 |
| 2009/0267102 A1 | 10/2009 | Tsai et al. | |
| 2009/0273004 A1 | 11/2009 | Lin et al. | |
| 2009/0278161 A1 | 11/2009 | Lee et al. | |
| 2009/0289273 A1 | 11/2009 | Tsai et al. | |
| 2010/0123148 A1 * | 5/2010 | Park | H01L 33/20 |
| | | | 257/94 |
| 2010/0141132 A1 * | 6/2010 | Shen | F21K 9/27 |
| | | | 257/E33.056 |
| 2010/0261335 A1 | 10/2010 | Andry et al. | |
| 2010/0264435 A1 | 10/2010 | Wang et al. | |
| 2011/0198618 A1 * | 8/2011 | Jeong | H01L 33/62 |
| | | | 257/E33.001 |
| 2011/0253972 A1 | 10/2011 | Xiong et al. | |
| 2011/0297980 A1 | 12/2011 | Sugizaki et al. | |
| 2012/0164797 A1 | 6/2012 | Lowenthal et al. | |
| 2012/0181640 A1 | 7/2012 | Von et al. | |
| 2012/0208323 A1 * | 8/2012 | Heinrich | H01L 24/03 |
| | | | 438/123 |
| 2013/0234193 A1 | 9/2013 | Odnoblyudov et al. | |
| 2018/0301602 A1 | 10/2018 | Odnoblyudov et al. | |

* cited by examiner

ETCHED TRENCHES IN BOND MATERIALS FOR DIE SINGULATION, AND ASSOCIATED SYSTEMS AND METHODS

CROSS-REFERENCE SECTION TO RELATED APPLICATION

This application is a continuation of U.S. application Ser. No. 16/008,836 filed Jun. 14, 2018, which is a divisional of U.S. application Ser. No. 14/617,668 filed Feb. 9, 2015, now U.S. Pat. No. 10,020,432, which is a divisional of U.S. application Ser. No. 13/415,677 filed Mar. 8, 2012, now U.S. Pat. No. 8,952,413, each of which is incorporated herein by reference.

TECHNICAL FIELD

The present technology is directed generally to etched trenches in bond materials for die singulation, and associated systems and methods.

BACKGROUND

Solid state transducer ("SST") devices are used in a wide variety of products and applications. Some solid state transducers can emit electromagnetic radiation in the visible light spectrum, thus being useful in, for example, mobile phones, personal digital assistants ("PDAs"), digital cameras, MP3 players, and other portable electronic devices for backlighting and other purposes. SST devices are also used for signage, indoor lighting, outdoor lighting, vehicle lighting, and other types of general illumination.

FIG. 1A is a cross-sectional view of a conventional SST device 10a having lateral contacts. As shown in FIG. 1A, the SST device 10a includes a light emitting diode ("LED") structure 30 on a growth substrate 17. The LED structure 30 has an active material 15 positioned between layers of N-type GaN 16 and P-type GaN 14. The active material 15 contains gallium nitride/indium gallium nitride (GaN/InGaN) multiple quantum wells ("MQWs"). The SST device 10a also includes a first contact 18 on the P-type GaN 14 and a second contact 19 on the N-type GaN 16. The first contact 18 typically includes a transparent and conductive material, e.g., indium tin oxide ("ITO"), to allow light to escape from the LED structure 30. In operation, electrical power is provided to the SST device 10a via the contacts 18, 19, causing the active material 15 to emit light.

FIG. 1B is a cross-sectional view of another conventional LED device 10b in which the first and second contacts 18 and 19 are opposite each other, e.g., in a vertical rather than lateral configuration. During formation of the LED device 10b, a growth substrate, similar to the growth substrate 17 shown in FIG. 1A, initially carries an LED structure 30 having an N-type GaN 16, an active material 15 and a P-type GaN 14. The LED structure 30 on the growth substrate (not shown) is attached to a carrier 21 using the first contact 18. One side of the first contact 18 is attached to the P-type GaN 14 and the other side of the first contact 18 is attached to the carrier 21. The growth substrate can be removed, allowing the second contact 19 to be disposed on the N-type GaN 16. The structure is then inverted to produce the orientation shown in FIG. 1B. In the LED device 10b, the first contact 18 typically includes a reflective and conductive material (e.g., silver or aluminum) to direct light toward the N-type GaN 16.

The SST devices are typically manufactured on wafers, e.g., semiconductor wafers. FIGS. 2A-2C illustrate a conventional technique for producing dies having the vertical configuration shown in FIG. 1B, using multiple wafers that are bonded together face-to-face. FIG. 2A illustrates a phase in the process at which an overall wafer assembly 40 includes first and second subassemblies 40a, 40b, e.g., two wafers. The first subassembly 40a includes the growth substrate 17, the active material 15 disposed between N-type GaN 16 and P-type GaN 14. Both the first and second subassemblies 40a, 40b include a first bond material 11 and second bond material 12. The first bond material 11 can be Ni and the second bond material 12 can be Sn. The first subassembly 40a is oriented such that the first and second bond materials face the first bond material 12 and the second bond material 11 of the second subassembly 40b. The first bond material 11 of the second subassembly 40b is disposed between the carrier 21 and the second bond material 12. The first materials 12 of the two subassemblies 40a, 40b are joined to form a composite wafer assembly, as explained in more detail in reference to FIG. 2B.

FIG. 2B illustrates the wafer assembly 40 having a bond material 20 formed during the process of joining subassemblies 40a, 40b. The bond material 20 has a layer of the second bond material 12 (Sn) between the layers of the first bond material 11 (Ni), e.g., an intermetallic compound (IMC). The thickness of the bond material 20 is typically in the range from 3 to 8 µm.

FIG. 2C illustrates the wafer assembly 40 after the growth substrate 17 has been removed. Additional conventional processing steps are preformed after this point, including singulating SST dies from the wafer assembly 40 in preparation for packaging the SST dies.

One feature of the foregoing process is that it can result in high residual stresses in the intermetallic compounds at the bond material 20. Additionally, a wafer "bow" can be induced by the CTE mismatch between the LED structure or die material 30 and the carrier 21, thus adding more stress to the bond material 20. The thick, highly stressed bond material 20 in turn causes difficulties during die singulation. For example, FIGS. 3A-B illustrate a die singulation process using a mechanical saw 46. A wafer 60 has bond material 20 connecting the die material 30 to the carrier 21. The mechanical saw 46 singulates the die material 30 by cutting through the exposed portion of the bond material 20. Due to high stress in the bond material 20, the singulated dies can delaminate at the interface between the bond material 20 and the carrier 21. If the bond material 20 is tough, e.g., it has high ultimate yield strength, the delamination can occur inside the carrier, as illustrated in FIG. 3B. Such a delamination renders the dies 80 nonusable, thus lowering manufacturing yields. Consequently, even though die singulation using mechanical saw is advantageous because of its low cost, it may not be practical for SST wafers because of the low manufacturing yield.

One approach to address the foregoing delamination problem is to replace the mechanical saw process with a laser singulation process, which may reduce the incidence of delamination. However, the laser singulation process requires many passes of a laser beam to remove material through the entire wafer thickness (hundreds of microns) and ultimately the laser singulation process becomes very expensive. Accordingly, there remains a need for cost effective SST wafer singulation methods that do not result in excessive SST delamination.

BRIEF DESCRIPTION OF THE DRAWINGS

Many aspects of the present disclosure can be better understood with reference to the following drawings. The components in the drawings are not necessarily to scale. Instead, emphasis is placed on clearly illustrating the principles of the present disclosure. Furthermore, in the drawings, like reference numerals designate corresponding parts throughout the several views.

DETAILED DESCRIPTION

Specific details of several embodiments of representative SST devices and associated methods of manufacturing SST devices are described below. The term "SST" generally refers to solid-state transducer devices that include a semiconductor material as an active medium to convert electrical energy into electromagnetic radiation in the visible, ultraviolet, infrared, and/or other spectra. For example, SSTs include solid-state light emitters (e.g., LEDs, laser diodes, etc.) and/or sources of emission other than electrical filaments, plasmas, or gases. LEDs include semiconductor LEDs, PLEDs (polymer light emitting diodes), OLEDs (organic light emitting diodes), and/or other types of solid state devices that convert electrical energy into electromagnetic radiation in a desired spectrum. In some embodiments, SSTs can include solid-state devices that convert electromagnetic radiation into electricity. Additionally, depending upon the context in which it is used, the term "substrate" can refer to a wafer-level substrate or to a singulated device-level substrate. A person skilled in the relevant art will also understand that the technology may have additional embodiments, and that the technology may be practiced without several of the details of the embodiments described below with reference to FIGS. 4A-6.

Methods and devices for singulating SST dies from a wafer are disclosed. The disclosed methods and systems enable SST die singulation from a wafer by using a mechanical saw with improved process yields. The SST dies can be manufactured on a wafer having a bond material that connects a carrier substrate to a die material. Because the bond material may have high residual stresses after the wafers are manufactured, the bond material can be selectively removed by, for example, chemical etching thus creating exposed trenches in the carrier substrate. The trenches in the carrier substrate can reduce the incidence of die delamination when the SST dies are singulated from the wafer for at least one of several reasons. For example, the trenches have lower stress levels than the bond material, and are thus less likely to promote crack initiation. Additionally, should the cracks initiate, the presence of the trenches tends to contain the crack propagation within the outline of the trenches in the substrate. Consequently, in at least some embodiments, a mechanical saw can be used along the trenches etched into the carrier substrate to singulate the SST dies from the wafer in a relatively inexpensive yet high-yield process.

Figure 1A:
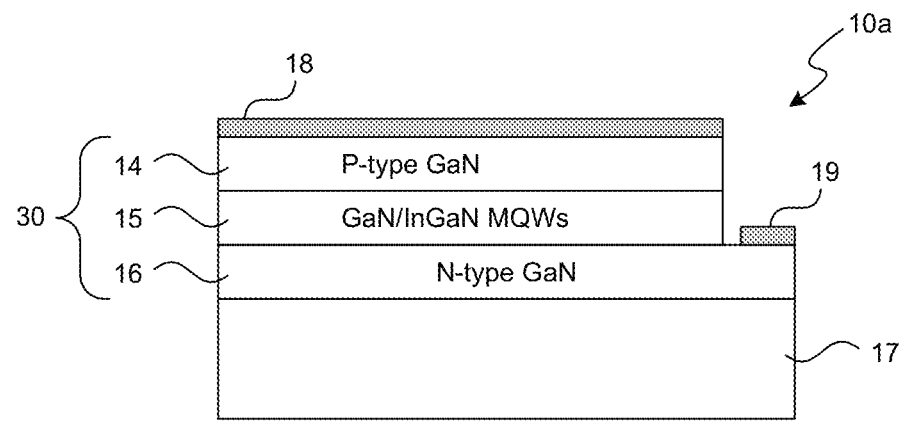
FIG. 1A is a partially schematic, cross-sectional illustration of an SST device having a growth substrate in accordance with the prior art.
Figure 1B:
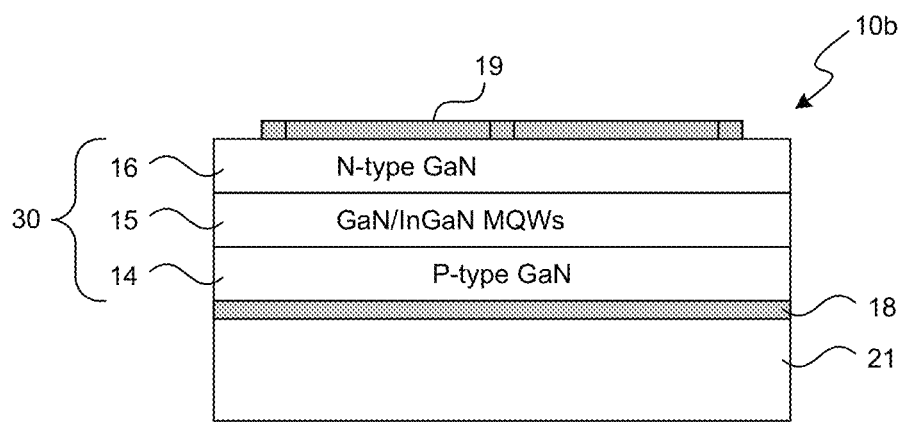
FIG. 1B is a partially schematic, cross-sectional illustration of an SST device having a carrier in accordance with the prior art.
Figure 2A:
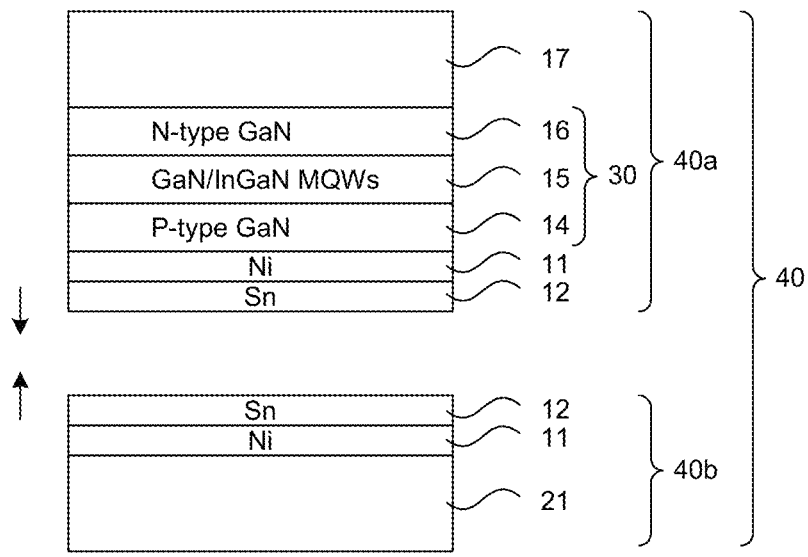
FIG. 2A is a partially schematic, cross-sectional illustration of prior art SST wafer subassemblies.
Figure 2B:
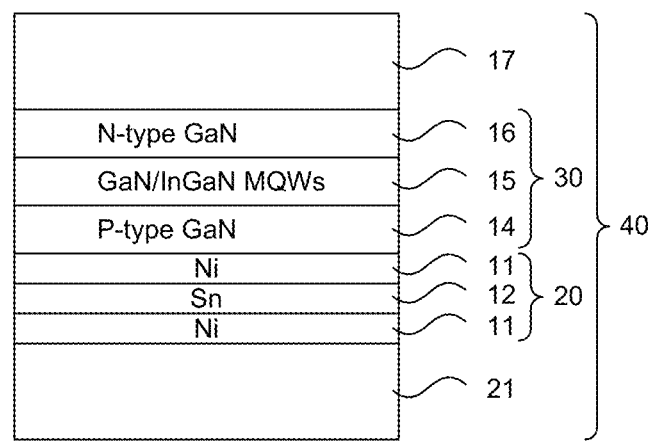
FIG. 2B is a partially schematic, cross-sectional illustration of a prior art SST wafer after the subassemblies are joined.
Figure 2C:
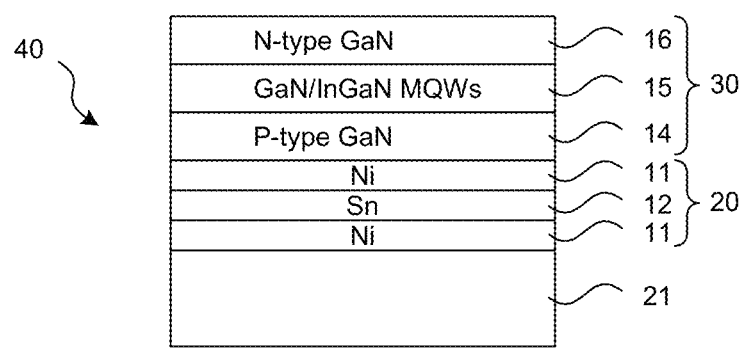
FIG. 2C is a partially schematic, cross-sectional illustration of a prior art SST wafer assembly after the growth substrate is removed.
Figure 3A:
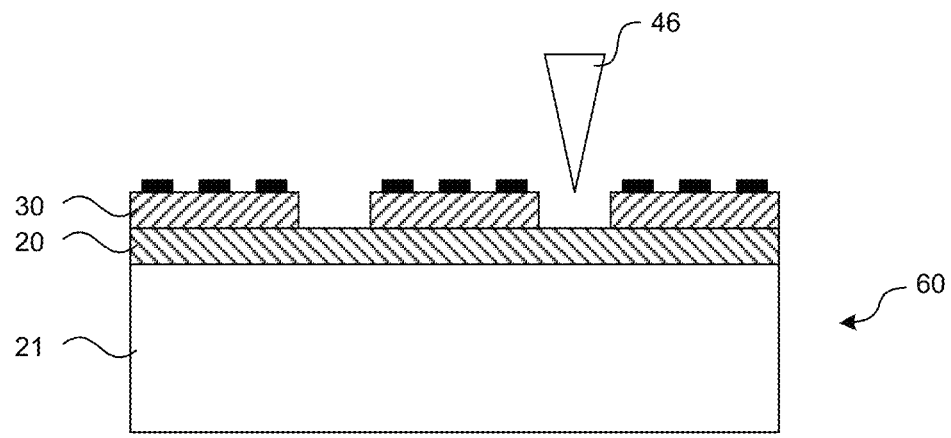
FIGS. 3A-3B are partially schematic illustrations of an SST singulation process in accordance with the prior art.
Figure 3B:
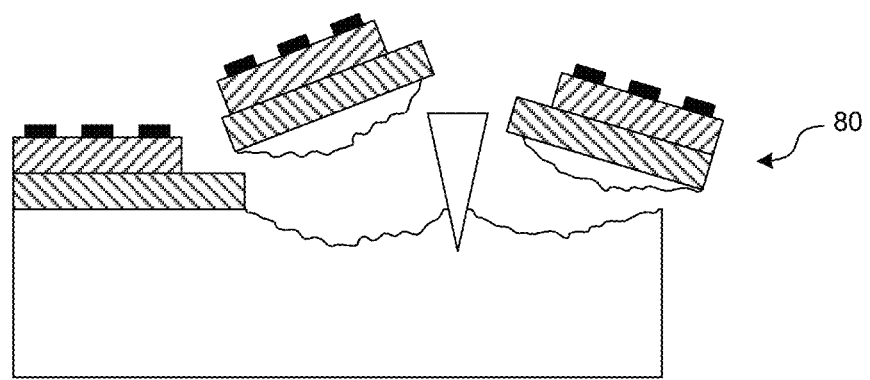
Figure 4A:
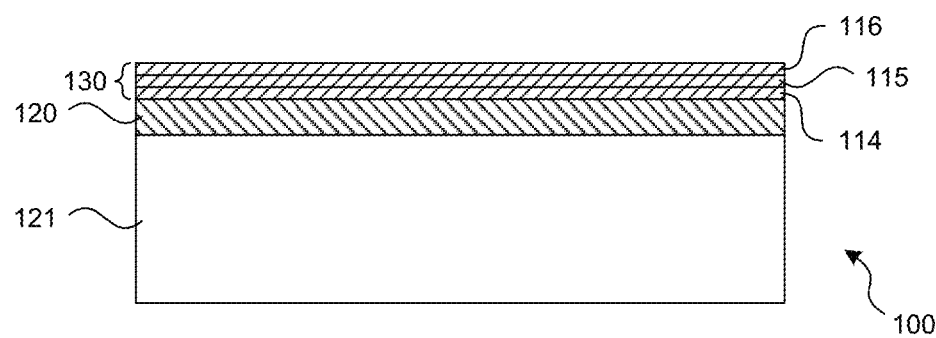
FIGS. 4A-4G are partially schematic, cross-sectional illustrations of SST wafer singulation processes in accordance with the presently disclosed technology.

FIGS. 4A-4G illustrate several steps of a representative SST singulation process in accordance with embodiments of the presently disclosed technology. FIG. 4A illustrates a wafer 100 or other suitable substrate that includes a die material 130 bonded to a carrier substrate 121 using a bond material 120. The wafer 100 illustrated in FIG. 4A may be generally similar to the wafer 40 illustrated in FIG. 2C. Accordingly, the wafer 100 can be formed by bonding a growth substrate (carrying the die material 130) to the carrier substrate 121, and then removing the growth substrate. The die material 130 in FIG. 4A has a second semiconductor material 114, an active material 115 and a second semiconductor material 116 exposed for further processing. The carrier substrate 121 can be crystalline silicon or another suitable material. The bond material 120 can be composed of metal or metal alloy layers. For example, the bond material can have a "sandwich" arrangement with Sn in the middle and Ni above and below the Sn, e.g., Ni in contact with the carrier 120 and the die material 130. In other embodiments, other bond materials including, for example, CuSn and/or TiSi are used. In still further embodiments, other bonding materials known in the art are contemplated. In any of these embodiments, the bond material 120 can be under a high level of stress. The high stress level can be due to residual stresses, e.g., stress remaining after the bonding process and/or stresses induced by a CTE mismatch, e.g., by a mismatch between the coefficient of thermal expansion of the die material 130 and carrier substrate 121.

The die material 130 in accordance with a particular embodiment includes the first semiconductor material 114, the second semiconductor material 116, and the active region 115 between the first and second semiconductor materials 114, 116. In one embodiment, the first semiconductor material 114 is a P-type gallium nitride ("GaN") material, the active region 115 is an indium gallium nitride ("InGaN") material, and the second semiconductor material 116 is an N-type GaN material. In different embodiments, the semiconductor constituents of the die material 130 can include at least one of gallium nitride ("GaN"), indium gallium nitride ("InGaN"), gallium arsenide ("GaAs"), aluminum gallium arsenide ("AlGaAs"), gallium arsenide phosphide ("GaAsP"), aluminum gallium indium phosphide (AlGaInP), gallium(III) phosphide ("GaP"), zinc selenide ("ZnSe"), boron nitride ("BN"), aluminum nitride ("AlN"), aluminum gallium nitride ("AGaN"), aluminum gallium indium nitride ("AlGaInN"), and/or another suitable semiconductor materials. In any of these embodiments, the combination of the first semiconductor material 114, the second semiconductor material 116 and the active region 115 operate to convert electrical energy to electromagnetic radiation, or vice versa.

Figure 4B:
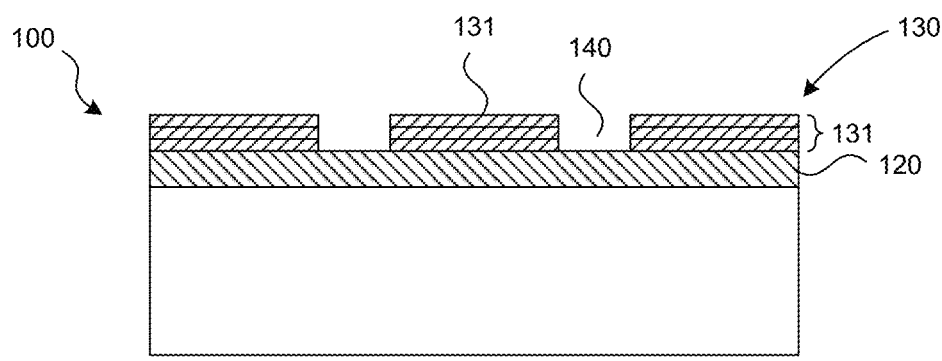

In FIG. 4B, several dicing streets 140 have been formed in the wafer 100 by etching the die material 130. Many suitable etchants including, for example, nitric acid or hydrofluoric acid may be used to form the dicing streets 140 in a photolithographic mask process or another process. The width of and separation between the dicing streets 140 can be selected to produce SST dies 131 having the general shape of a "mesa." Once the dicing streets 140 have been formed, the underlying bond material 120 is exposed, and is subjected to further processing as explained below.

Figure 4C:
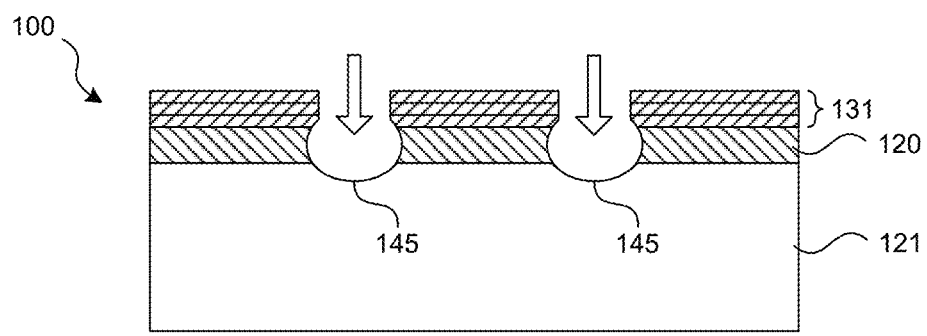

In FIG. 4C, trenches 145 have been formed between neighboring SST dies 131. Selective metal etchants can be used to etch through the bond material 120 and any surrounding materials, e.g., barrier materials, seed materials, and/or adhesion materials (not shown in FIG. 4C). An example of a suitable etchant is a nitric acid wet etchant, which etches metals, but does not etch GaN-based materials. In other embodiments, multiple etchants are applied to the wafer 100 sequentially to remove multiple materials, e.g., materials that may be disposed over or on the carrier substrate 121, and/or may otherwise be positioned between the carrier substrate 121 and the dies 131. The trenches 145 can extend through the bond material 120. In some embodiments, the trenches 145 extend completely through the bond material 120 to at least expose the underlying carrier substrate 121. In further particular embodiments, the trenches 145 can extend partially into the carrier substrate 121, as illustrated in FIG. 4C. The layout of the trenches 145 illustrated in FIG. 4C generally follows the layout of the dicing streets 140 illustrated in FIG. 4B. After partially removing the bond material 120 to form the trenches 145, the dies 131 are supported in position relative to each other by the carrier substrate 121.

Figure 4D:
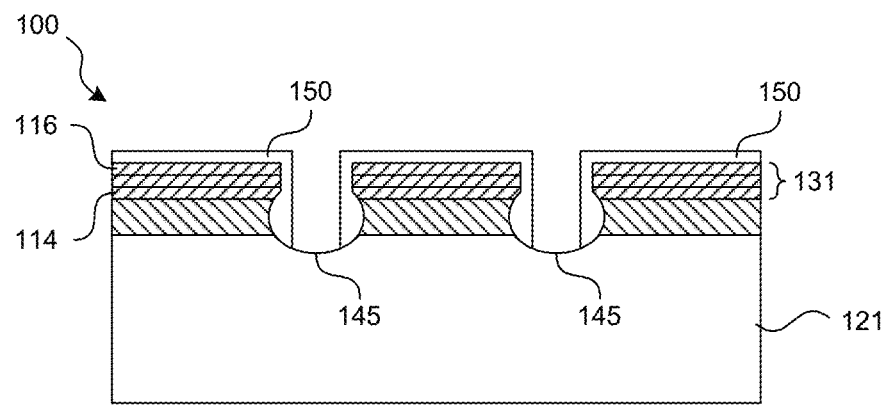

In FIG. 4D, an encapsulant or other suitable protective material 150 has been disposed over the dies 131 and in the trenches 145. The protective material 150 protects the dies 131 and other parts of the wafer 100 from environmental or electro/mechanical damage including, for example, environmental exposure that may cause electrical shorting. In some embodiments, the protective material 150 can be disposed to adhere primarily to the sides and not the bottoms of the trenches 145. In other embodiments, the protective material 150 can be disposed over all interior surfaces of the trenches 145 and then removed from the bottom surfaces. In still further embodiments the protective material 150 can remain at the bottoms of the trenches 145. The protective material 150 can be a dielectric material including, for example, one or more polymers and/or epoxies. The protective material 150 can be disposed using known techniques, for example potting, porosity sealing, liquid filling, or/and conformal coating. In at least some embodiments, the protective material 150 can be a highly transparent silicone-based material, which can be dispensed of injection-molded to dies, or pre-molded and then applied to dies to control whether the bottoms of the trenches 145 are covered.

Figure 4E:
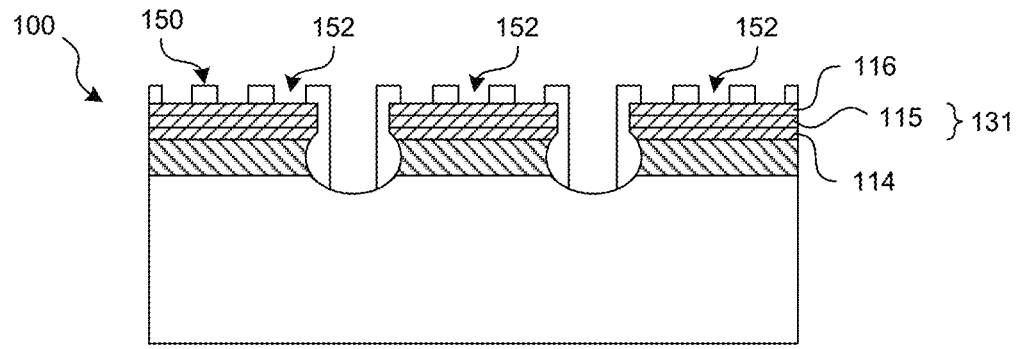

Electrical contacts are formed to provide electrical communication with the dies 131. The contacts can include first contacts connected to the first semiconductor material 114 and second contacts connected to the second semiconductor material 116. In FIG. 4E, one or more openings 152 have been made in the protective material 150 to facilitate forming the contacts. The openings 152 are patterned to expose electrical pads (not shown) at the second semiconductor material 116 of the dies 131. Any of a number of suitable techniques may be used to form the openings 152 in the protective material 150 including, for example, photolithography with a positive or a negative mask, followed by etching.

Figure 4F:
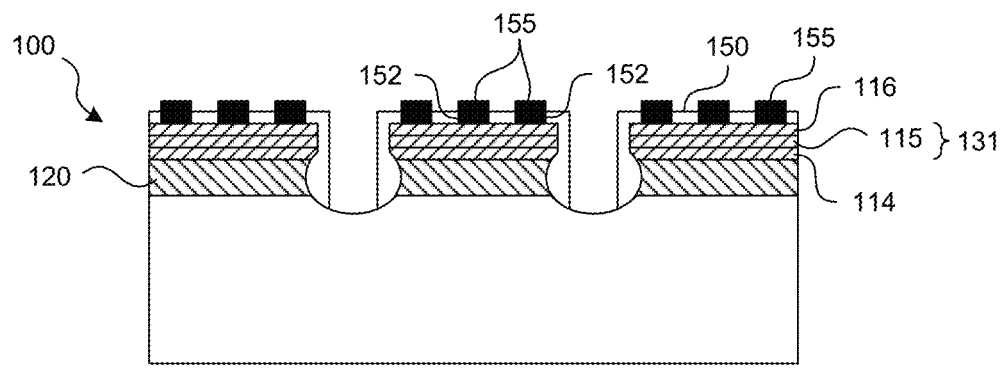

In FIG. 4F, a pattern of second electrical contacts 155, e.g., N-contacts, has been formed on the dies 131 in contact with second semiconductor material 116 and in the openings 152 of the protective material 150. The second contacts 155 can be formed by, for example, electroless or electrolyte plating techniques, and/or other suitable processes. The second contacts 155 can comprise any of a variety of suitable materials including, for example, Cu, Al, Au and Ag. Corresponding first contacts, e.g., P-contacts (not shown in FIG. 4F) can be formed to connect to the first semiconductor material 114. For example, the first contacts can be formed from or connected to the bond material 120. The bond material 120 can be accessed from the side of the die opposite the second contacts 155, or through-wafer vias can be used to connect to the first semiconductor material 114 from the same side of the die 131 as the second contacts 155.

Figure 4G:
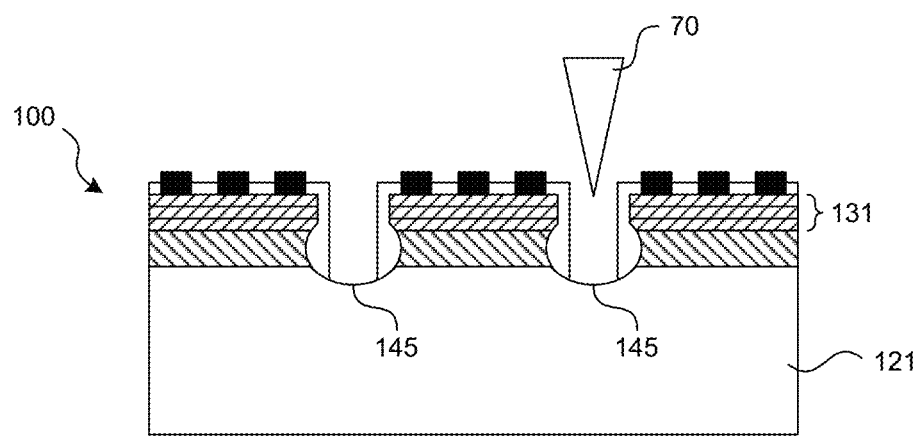

FIG. 4G illustrates a process for singulating the dies 131 from the wafer 100. In a particular embodiment, a mechanical saw 70 (shown schematically in FIG. 4G) is used to carry out the singulation process. Because the bond material 120 has been partially removed from the wafer 100 (as described above with respect to FIG. 4C), thus reducing the stress concentrations along trenches 145, the mechanical saw 70 can be used for the singulation process without an undue yield reduction. For example, due to the reduced stress concentration at the trenches 145, the incidence of the dies 131 delaminating from the carrier substrate 121 can be reduced, resulting in higher manufacturing yields.

Once the dies 131 have been singulated from the wafer or substrate 100, the dies 131 can be further processed before use. Additional processing can include packaging, testing and/or other routine operations associated with manufacturing SST dies.

One feature of embodiments of the presently disclosed technology discussed above is that they can reduce stress in the bond between a die and a carrier substrate. An advantage of the presently disclosed technology is that it can reduce yield losses due to delamination and/or other stress-induced defects that may result from the die singulation process. This in turn can make certain die singulation processes more economically feasible. For example, mechanical sawing, which can be relatively expensive due to low yield, can become relatively inexpensive when used in combination with the foregoing trench-forming processes. This in turn can reduce costs when compared with laser dicing, while still allowing the robust manufacturing performance associated with thicker carriers. Although the presently disclosed techniques can have particular applicability when used in conjunction with mechanical sawing processes for dicing, such techniques can have applicability to other dicing processes, including laser dicing. Such other processing, in addition to laser dicing, may include a sapphire based scribe and break process, which involves scribing a shallow scribe channel in the trenches between the dies to weaken the wafer along the scribe channels, followed by mechanically breaking the wafer along the scribe channels. Additionally, a two-step stealth dicing process may be used, where during the first step defects in the wafer are created along the trenches by focusing laser light beneath the surface of the trenches. An example of a suitable laser light source is a Nd:YAG laser having a wavelength of 1064 nm and pulsing frequency of about 100 kHz which causes of rapid melting and re-solidification of small volumes of material around the focus point of the laser beam. The defects in the wafer can help to create a preferred crack propagation path. In the second step of the stealth dicing process, the wafer is mechanically broken along the trenches.

Figure 5:
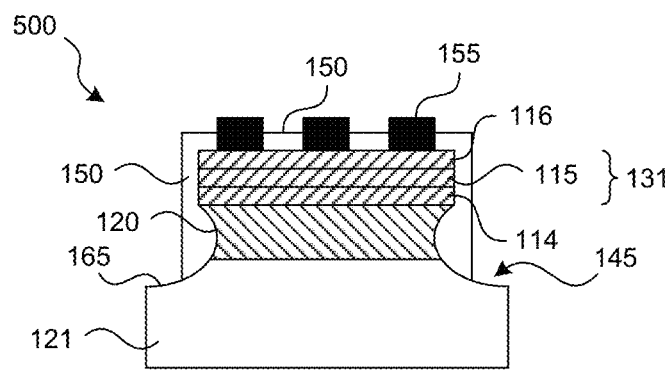
FIG. 5 is a partially schematic, cross-sectional illustration of an SST die in accordance with an embodiment of the presently disclosed technology.

FIG. 5 illustrates an embodiment of a singulated SST device 500 which can be produced by the die singulation process described with reference to FIGS. 4A-4G. The singulated SST device 500 has the die 131 attached with the carrier substrate 121 by the bond material 120. The active material 115 can emit or absorb electromagnetic radiation (in the visible spectrum or outside of it) when proper electrical connection is established through the N-contacts 155 and the associated P-contacts (not shown). Certain elements of known SST packaging techniques, for example, wire leads, reflectors, heat spreaders, etc., are not shown in the simplified representation of the singulated SST 500 of FIG. 5. The carrier substrate 121 can have an indentation 165 formed as a result of etching the bond material 120 and the carrier substrate 121. The protective material 150 can be disposed around the die 131 and bond material 120. In certain embodiments, the sides of the protective material may be generally vertical, thus not entirely filling the trench 145 and the indentation 165. Therefore, after the die singulation process is completed, the indentation 165 can remain in the carrier substrate 121. The indentation 165 is a segment of the trench 145 which is not covered by the protective material layer 150.

Figure 6:
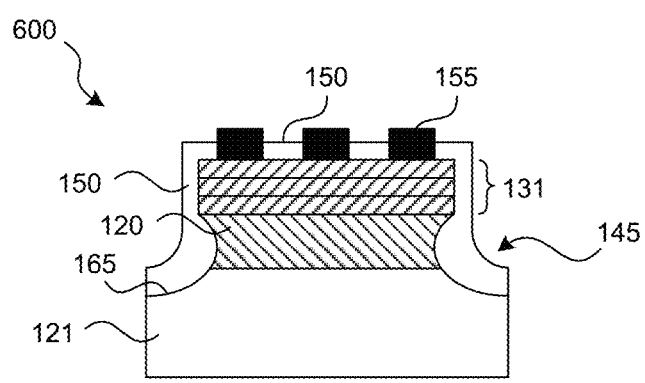
FIG. 6 is a partially schematic, cross-sectional illustration of an SST die in accordance with another embodiment of the presently disclosed technology.

FIG. 6 illustrates another embodiment of a singulated SST device 600 that has been produced by the die singulation process as described with reference to FIGS. 4A-4G. In the embodiment illustrated in FIG. 6, the protective material 150 completely covers the surfaces of the trench 145. Therefore, following the die singulation process as shown in, for example, FIG. 4G, the protective material 150 follows the contour of the indentation 165 at the bottom 145 surface of the trench.

From the foregoing, it will be appreciated that specific embodiments of the technology have been described herein for purposes of illustration, but that various modifications may be made without deviating from the disclosure. For example, different materials can be used for SST devices and/or the substrates in further embodiments. Furthermore, different semiconductor processing steps including, for example, several using etchants per processing step can be used. Additionally, the structures of the devices may differ from those shown in the Figures. For example, several dies 131 can be combined into one SST device or/and one package. In at least some embodiments, the above-described die singulation methods and systems are applicable to non-SST die including, for example, a general purpose logic integrated circuit or a memory chip. Moreover, while various advantages and features associated with certain embodiments have been described above in the context of those embodiments, other embodiments may also exhibit such advantages and/or features, and not all embodiments need necessarily exhibit such advantages and/or features to fall within the scope of the technology. Accordingly, the disclosure can encompass other embodiments not expressly shown or described herein.

We claim:

1. A solid state transducer (SST) device, comprising:
   a SST die including a layer of first semiconductor material a layer of second semiconductor material, and a layer of active material disposed between the layers of first and second semiconductor materials;
   a carrier substrate;
   a bond material directly bonding the layer of second semiconductor material and the carrier substrate, the bond material having concave sidewalls extending between the layer of second semiconductor material and the carrier substrate; and
   a protective material encapsulating at least the concave sidewalls of the bond material, the protective material having vertical sidewalls, the vertical sidewalls extending below an upper surface of the carrier substrate, wherein the SST die has a first width along a lateral axis, the carrier substrate has a second width along the lateral axis greater than the first width, and the bond material has a third width along the lateral axis, measured between recessed regions of opposite ones of the concave sidewalls, less than the first width.

2. The SST device of claim 1, wherein the third width corresponds to a narrowest portion of the bond material along the lateral axis.

3. The SST device of claim 1, wherein outer surfaces of the bond material intersecting the lateral axis have curved profiles.

4. The SST device of claim 1, wherein the second width corresponds to a widest portion of the carrier substrate along the lateral axis.

5. The SST device of claim 1, wherein outer surfaces of the carrier substrate spaced apart by the second width have generally planar profiles.

6. The SST device of claim 1, wherein outer surfaces of the carrier substrate along the lateral axis that are spaced apart by less than the second width have curved profiles.

7. The SST device of claim 1, wherein the protective material encapsulates outer surfaces of the SST die and the carrier substrate, wherein the outer surfaces intersect the lateral axis.

8. The SST device of claim 7, wherein the protective material at least partially encapsulates a top surface of the SST die.

9. The SST device of claim 7, wherein the protective material does not encapsulate outermost surfaces of the carrier substrate that intersect the lateral axis.

10. The SST device of claim 7, wherein the protective material comprises a dielectric polymer, a dielectric epoxy, or a combination thereof.

11. The SST device of claim 7, wherein the protective material comprises a silicone-based material that is generally transparent to a wavelength of radiation configured to be emitted by the SST die.

12. The SST device of claim 1, wherein the carrier substrate comprises crystalline silicon.

13. The SST device of claim 1, wherein the bond material includes at least one of NiSn, CuSn and TiSi.

14. A solid state transducer (SST) device, comprising:
   a SST die having a first width along a lateral axis, the SST die including a layer of first semiconductor material a layer of second semiconductor material, and a layer of active material disposed between the layers of first and second semiconductor materials;
   a carrier substrate having a second width along the lateral axis greater than the first width;
   a bond material directly bonding the layer of second semiconductor material and the carrier substrate, wherein the bond material has outer surfaces intersecting the lateral axis with opposing concave profiles; and
   a protective material encapsulating at least the outer surfaces of the bond material with opposing concave profiles, the protective material having sidewalls with a vertical portion alongside the SST die and a curvilinear portion generally following a curvature of an indentation in the carrier substrate.

15. The SST device of claim 14, wherein the bond material has a third width along the lateral axis less than the first width.

16. The SST device of claim 15, wherein the third width corresponds to a narrowest portion of the bond material along the lateral axis.

17. The SST device of claim 14, wherein the second width corresponds to a widest portion of the carrier substrate along the lateral axis.

18. The SST device of claim 14, wherein outer surfaces of the carrier substrate spaced apart by the second width have generally planar profiles.

19. The SST device of claim 14, wherein outer surfaces of the carrier substrate along the lateral axis that are spaced apart by less than the second width have curved profiles.

20. The SST device of claim 14, further comprising a protective material encapsulating outer surfaces of the SST die, the carrier substrate, and the bond material, wherein the outer surfaces intersect the lateral axis.

\* \* \* \* \*